(12) United States Patent
Yamashita et al.

(10) Patent No.: US 9,159,633 B2
(45) Date of Patent: Oct. 13, 2015

(54) TEST MACRO FOR USE WITH A MULTI-PATTERNING LITHOGRAPHY PROCESS

(71) Applicants: International Business Machines Corporation, Armonk, NY (US); GlobalFoundries, Inc., Grand Cayman, KY (US)

(72) Inventors: Tenko Yamashita, Schenectady, NY (US); Chun-Chen Yeh, Clifton Park, NY (US); Jin Cho, Palo Alto, CA (US); Hui Zang, Albany, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/026,172

(22) Filed: Sep. 13, 2013

(65) Prior Publication Data
US 2015/0076498 A1   Mar. 19, 2015

(51) Int. Cl.
*H01L 23/58* (2006.01)
*H01L 29/10* (2006.01)
*H01L 21/66* (2006.01)
*H01L 21/8234* (2006.01)

(52) U.S. Cl.
CPC ........ *H01L 22/14* (2013.01); *H01L 21/823431* (2013.01); *H01L 22/10* (2013.01); *H01L 22/12* (2013.01)

(58) Field of Classification Search
CPC . H01L 22/10; H01L 22/14; H01L 21/823431; H01L 22/12
See application file for complete search history.

(56) References Cited

U.S. PATENT DOCUMENTS

| 6,528,818 | B1 | 3/2003 | Satya et al. |
| 7,067,335 | B2 | 6/2006 | Weiner et al. |
| 7,432,553 | B2 | 10/2008 | Chen et al. |
| 7,538,344 | B2 | 5/2009 | Mellinger et al. |
| 7,800,106 | B2 | 9/2010 | Feustel et al. |
| 2009/0217224 | A1 | 8/2009 | Wiaux et al. |

OTHER PUBLICATIONS

Doong et al., "Field-Configurable Test Structure Array (FC-TSA): Enabling Design for Monitor, Model, and Manufacturability," IEEE Transactions on Semiconductor Manufacturing, vol. 21, No. 2, 2008, pp. 169-179.

(Continued)

*Primary Examiner* — Stephen W Smoot
*Assistant Examiner* — Vicki B Booker
(74) *Attorney, Agent, or Firm* — Cantor Colburn LLP

(57) ABSTRACT

A method for forming an integrated circuit having a test macro using a multiple patterning lithography process (MPLP) is provided. The method includes forming an active area of the test macro having a first and second gate region and forming a first and second source/drain regions in the active area. The method also includes forming a first contact connected to the first gate region, a second contact connected to the second gate region, a third contact connected to the first source/drain region, and a forth contact connected to the source/drain region. The method further includes determining if an overlay shift has occurred during the formation of the active area by testing for a short between one or more of the first contact, the second contact, the third contact, or the fourth contact.

8 Claims, 7 Drawing Sheets

(56) References Cited

OTHER PUBLICATIONS

Doong et al., "4K-Cells Resistive and Charge-Base-Capacitive Measurement Test Structure Array (R-CBCM-TSA) for CMOS Logic Process Development, Monitor and Model", IEEE International Conference on Microelectronic Test Structures, ICMTS 2009, pp. 216-220.

Halle et al., "Enhanced Process Control of Pitch Split Double Patterning by Use of CD-SEM Critical Dimension Uniformity and Local Overlay Metrics", 23rd Annual Advanced Semiconductor Manufacturing Conference (ASMC), 2012, 321-326.

Hess et al., "Influence of short circuits on data of contact and via open circuits determined by a novel weave test structure," IEEE Transactions on Semiconducor Manufacturing, vol. 9, No. 1, 1996, pp. 27-34.

TEST MACRO FOR USE WITH A MULTI-PATTERNING LITHOGRAPHY PROCESS

BACKGROUND

The present invention relates generally to semiconductor fabrication and more specifically to, a test macro for use with a multi-patterning lithography process.

High level macros are designed to provide connections to various lower level electrical devices, such as transistors. As the scale and type of these lower level devices continues to evolve, the design of these high level macros has become more complex. In addition, various techniques for are used for manufacturing integrated circuits embodying the macros.

For integrated circuits having lower level devices, which are referred to as high pitch devices, a multiple patterning lithography processes are often utilized for manufacturing the integrated circuit. A multi-patterning lithography process includes subsequent patterning of metal layers on an integrated circuit. Multiple patterning is a class of technologies for manufacturing integrated circuits (ICs), developed for photolithography to enhance the feature density. A simple example of multiple patterning is double patterning, where a conventional lithography process is enhanced to produce double the expected number of features. In general, the resolution of a photoresist pattern begins to blur at around 45 nm half-pitch. Accordingly, double patterning was introduced for the 32 nm half-pitch node and below.

Currently, integrated circuits formed by a multiple patterning lithography process experience can failures due to overlay shift. As used herein, an overlay shift is the unintended overlay of metal layers that are not designed to be connected during the manufacturing process. In many cases, it is difficult to determine which step of the multiple lithography processes is the cause of the overlay shift.

SUMMARY

According to one embodiment, a method for forming an integrated circuit having a test macro using a multiple patterning lithography process is provided. The method includes forming an active area of the test macro of the integrated circuit, forming a first gate region and a second gate region in the active area during a first step of the multiple patterning lithography process, and forming a first source/drain region and a second source/drain region in the active area during a second step of the multiple patterning lithography process. The method also includes forming a first contact configured to connect to the first gate region, a second contact configured to connect to the second gate region, a third contact configured to connect to the first source/drain region, and a forth contact configured to connect to the source/drain region and determining if an overlay shift occurred between the first step and the second step of the step of the multiple patterning lithography process by testing for a short between one or more of the first contact, the second contact, the third contact, or the fourth contact.

According to another embodiment, an integrated circuit having a test macro is provided. The test macro includes an active region comprising one or more first gate regions, one or more first source/drain regions disposed adjacent to the one or more first gate regions, one or more second gate regions disposed adjacent to the one or more first source/drain regions, one or more second source/drain regions disposed adjacent to the one or more second gate regions. The test macro also includes a first contact configured to provide an electrical connection to the first gate region, a second contact configured to provide an electrical connection the second gate region, a third contact configured to provide an electrical connection to the first source/drain region, and a fourth contact configured to provide an electrical connection to the second source/drain region. A short circuit between one or more of the first contact, the second contact, the third contact, or the fourth contact indicates an overlay shift between the at least two of the one or more first gate regions, the one or more first source/drain regions, the one or more second gate regions, and the one or more second source/drain regions.

According to a further embodiment, a method for forming an integrated circuit having a test macro using a multiple patterning lithography process is provided. The method includes forming an active area of the test macro of the integrated circuit, forming a first gate region in the active area during a first step of the multiple patterning lithography process, and forming a first source/drain region in the active area during a second step of the multiple patterning lithography process. The method further includes forming a second source/drain region in the active area during a third step of the multiple patterning lithography process, forming a third source/drain region in the active area during a fourth step of the multiple patterning lithography process, and forming a first contact configured to connect to the first gate region, a second contact configured to connect to the first source/drain region, a third contact configured to connect to the second source/drain region, and a forth contact configured to connect to the fourth source/drain region. The method also includes determining if an overlay shift occurred during the multiple patterning lithography process by testing for a short between one or more of the first contact, the second contact, the third contact, or the fourth contact.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

DETAILED DESCRIPTION

Figure 1A:
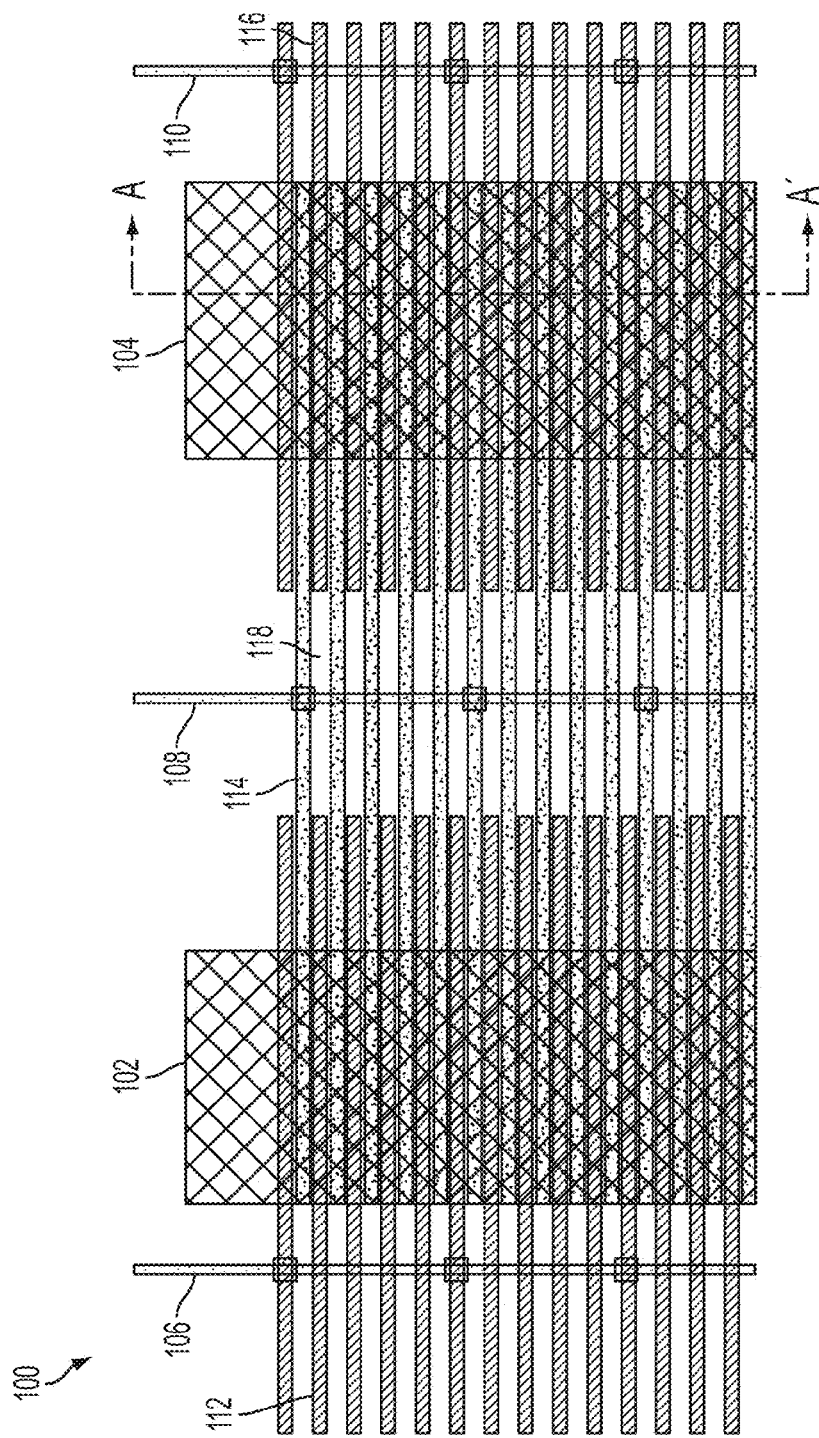
FIG. 1A is a top view of a prior art test macro design.

Referring now to FIG. 1, a top view of a prior art test macro 100 is shown. As illustrated, the test macro 100 includes a first active region 102 and a second active region 104. In exemplary embodiments, the active region 102, 104 may include bulk finFETs or other various electrical components. In addition, the test macro 100 includes a first contact 106, a second contact 108 and a third contact 110 that are used to access portions of the first active region 102 and the second active region 104.

Figure 1B:
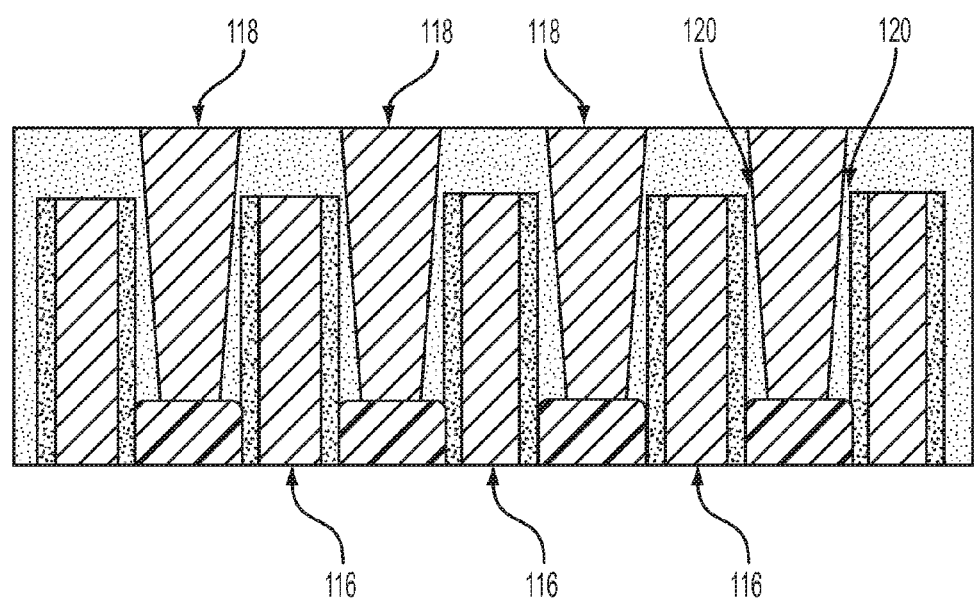
FIG. 1B is a cross sectional view of a prior art test macro design.

FIG. 1B illustrates a cross sectional view of the active region 104 taken along line A-A'. As illustrated, the second active 104 region includes gate region 116 and a source/drain region 118. Likewise, the first active 102 region includes gate region 112 and a source/drain region 114. A gate region 112 of the first active region 102 is accessed using the first contact 106 and a gate region 116 of the second active region 104 is accessed using the third contact 110. Both the gate region 112 and the gate region 116 are formed using a single lithography process. Similarly, a source/drain region 114 of the first active region 102 and a source/drain region 118 of the source/drain region 118 are accessed using the second contact 108. Both the source/drain region 114 and the source/drain region 118 are formed using a single lithography process.

Currently, the gate regions 112, 116 and the source/drain regions 114, 118 are patterned in subsequent steps. For example, the gate regions 112, 116 may be formed during one patterning step and source/drain regions 114, 118 may be formed in a subsequent patterning step. Accordingly, an overlay shift can occur during these subsequent patterning steps which may result in one or more of the adjacent source/drain regions 114, 118 and gate regions 112, 116 contacting one another. For example, an overlay shift occurs when the spacing 120 between an adjacent source/drain regions 114, 118 and gate regions 112, 116 is below a minimum allowed distance.

If one of the source/drain regions 114, 118 overlaps with the gate region 112 a short circuit will exist between the first contact 106 and the second contact 108. Likewise, if one of the source/drain regions 114, 118 overlaps with the gate region 116 a short circuit will exist between the second contact 108 and the third contact 110. In the case where one of the source/drain regions 114, 118 overlaps with the gate regions 112, 116 it is difficult to ascertain which of the source/drain regions 114, 118 overlaps since the source/drain regions 114, 118 are both connected to the second contact 108. For example, when a short circuit is detected between the first contact 106 and the second contact 108 the location of the overlap could either be between the source/drain region 114 and the gate region 112 or between the source/drain region 118 and the gate region 112.

In exemplary embodiments, a test macro includes one or more low level electrical components, such as bulk finFETs or other various electrical components. The test macro also includes a plurality of contacts that are used to communicate with the low level electrical components. The electrical components include a plurality of elements such as source/drain regions and gate regions that are each connected to a contact of the test macro. In exemplary embodiments, the source/drain regions and gate regions are formed using different steps of a multiple patterning lithography process, which may result in an overlay shift error that overlaps one or more adjacent elements. In exemplary embodiments, the test macro includes a sufficient number of contacts and an arrangement of elements that allows the location of an overlay shift to be determined.

Figure 2:
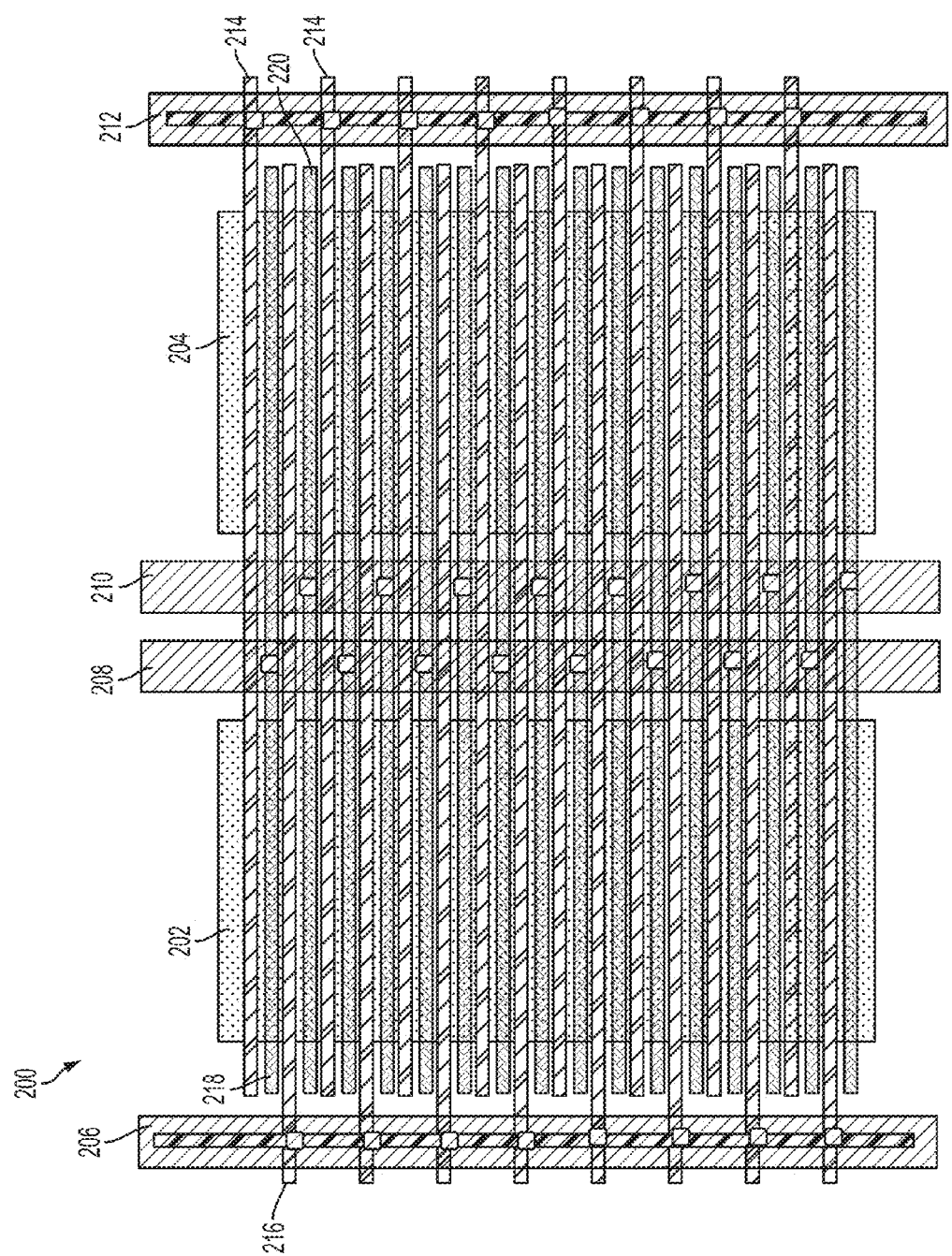
FIG. 2 is a top view of a test macro design in accordance with an exemplary embodiment.

Referring now to FIG. 2, a top view of a test macro 200 in accordance with an exemplary embodiment is shown. As illustrated, the test macro 200 includes a first active region 202 and a second active region 204. In exemplary embodiments, the active regions 202, 204 may be bulk finFETs or other various other electrical components that have a dimension of about 14 nanometers. The 14 nanometers refers to the average half-pitch (i.e., half the distance between identical features) of a memory cell at this technology level. In addition, the test macro 200 includes a first contact 206, a second contact 208, a third contact 210 and a fourth contact 212 that are used to access the first active region 202 and the second active region 204.

In exemplary embodiments, the first active region 202 and the second active region 204 include a gate region 216 that is connected to the first contact 206. Likewise, the first active region 202 and the second active region 204 include a gate region 214 that is connected to the fourth contact 212. The first active region 202 and the second active region 204 include a source/drain region 218 that is connected to the second contact 208. The first active region 202 and the second active region 204 include a source/drain region 220 that is connected to the third contact 210.

In exemplary embodiments, the source/drain regions 218, 220 and the gate regions 214, 216 are patterned in subsequent steps of a multiple patterning lithography process. For example, the gate regions 214, 216 may be formed during one patterning step and source/drain regions 218, 220 may be formed in a subsequent patterning step. Accordingly, an overlay shift can occur during these subsequent patterning steps which may result in one or more of the adjacent source/drain regions and gate regions contacting one another. In exemplary embodiments, an integrated circuit fabricated having a test macro 200 can be tested to determine the presence, and location, of an overlay shift.

In exemplary embodiments, if two of the adjacent leads source/drain regions and gate regions are overlapped during patterning process the location of the overlap the location of the overlap is easily ascertainable. For example, if the gate region 214 and the source/drain region 218 are overlapped, a short will be observed between the second contact 208 and the fourth contact 212. Accordingly, a short between the first contact 206 and the second contact 208 would indicate that the gate region 216 and the source/drain region 218 are overlapping. A short between the first contact 206 and the third contact 210 would indicate that the gate region 216 and the source/drain region 220 are overlapping. A short between the third contact 210 and the fourth contact 212 would indicate that the gate region 214 and the source/drain region 220 are overlapping. Accordingly, a short circuit observed between to contacts of an integrated circuit formed according to the test macro 200 can be used to identify the location of an overlay shift, which is causing the short circuit.

In exemplary embodiments, an integrated circuit having a test macro 200 on a portion of the integrated circuit is formed using a double patterning lithography process. The test macro 200 is configured to test the double patterning lithography process used to form the integrated circuit to determine if an overlay shift has occurred. In exemplary embodiments, testing the operation of the test macro 200 can not only be used to identify that an overlay shift occurred during the double patterning lithography process, but it can also identify the location on the test macro of the overlay shift.

Figure 3:
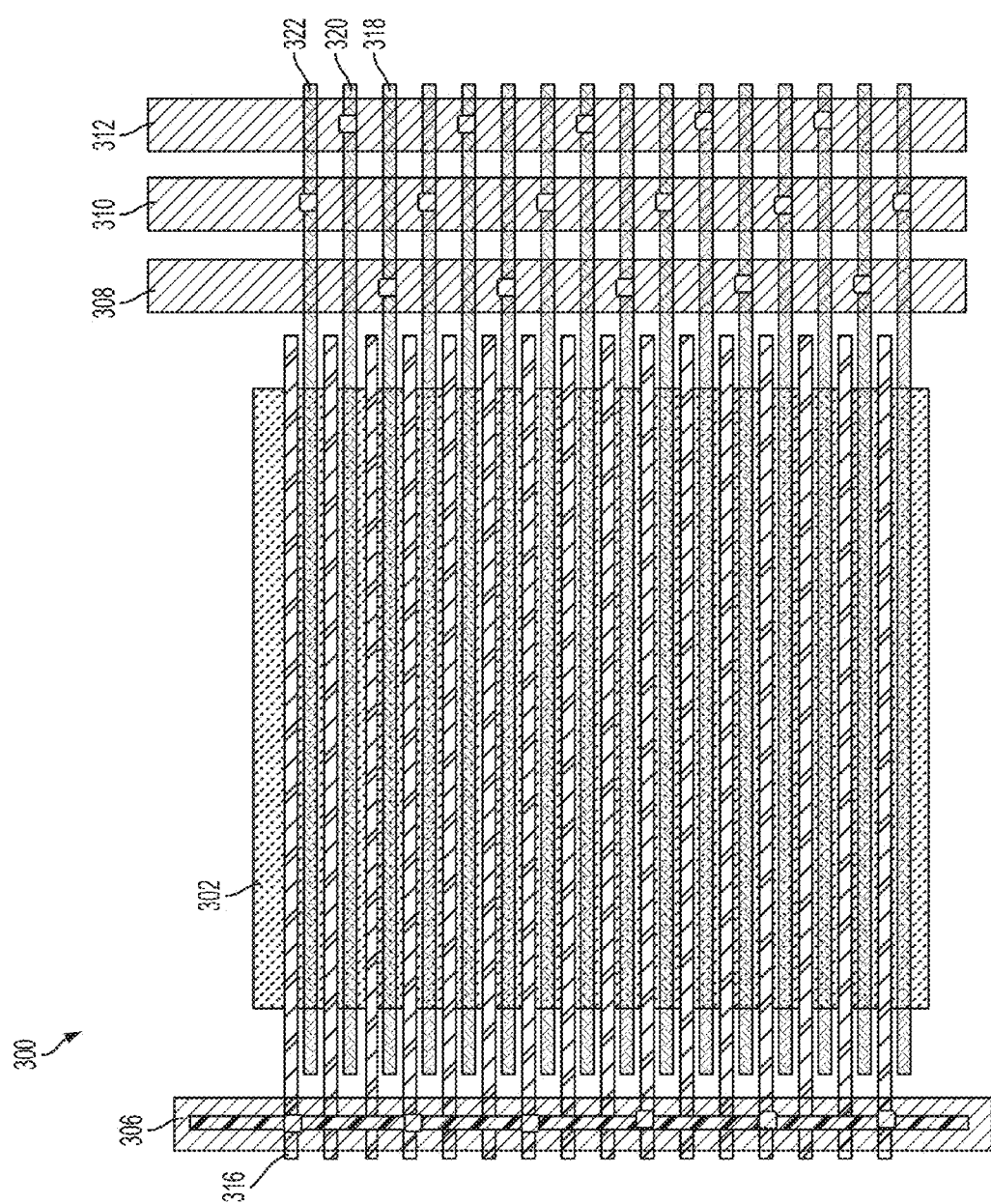
FIG. 3 is a top view of a test macro design in accordance with an exemplary embodiment.

Referring now to FIG. 3, a top view of a test macro 300 in accordance with an exemplary embodiment is shown. As illustrated, the test macro 300 includes a first active region 302. In exemplary embodiments, the active region 302 may be bulk finFETs or other various other electrical components that have a dimension of 10 nanometers. The 10 nanometers refers to the average half-pitch (i.e., half the distance between identical features) of a memory cell at this technology level.

In addition, the test macro 300 includes a first contact 306, a second contact 308, a third contact 310 and a fourth contact 312 that are used to access various portions of the first active region 302, such as gate and source/drain regions.

In exemplary embodiments, the active region 302 includes a gate region 316 that is connected to the first contact 306. The first active region 302 also includes source/drain regions 318, 320, 322 that are respectively connected to the second contact 308, the third contact 310 and the fourth contact 312. In exemplary embodiments, the gate region 316 and the source/drain regions 318, 320, 322 may be patterned in subsequent steps of a multiple patterning lithography process. For example, the gate region 316 may be formed during a first patterning step, source/drain regions 318 may be formed during a second patterning step, source/drain regions 320 may be formed during a third patterning step and source/drain regions 322 may be formed in a fourth patterning step.

Accordingly, an overlay shift can occur during any of these subsequent patterning steps which may result in one or more of the adjacent drain regions and source/drain regions contacting one another. In exemplary embodiments, an integrated circuit fabricated having a test macro 300 can be tested to determine the presence, and location, of an overlay shift.

In exemplary embodiments, if two of the adjacent source/drain regions 318, 320, 322 and the gate region 316 are overlapped during patterning process the location of the overlap the location of the overlap is easily ascertainable. For example, if the gate region 316 and the source/drain region 318 are overlapped, a short will be observed between the first contact 308 and the fourth contact 312. Accordingly, a short between the first contact 306 and the second contact 308 would indicate that the gate region 316 and the source/drain region 318 are overlapping. A short between the first contact 306 and the third contact 310 would indicate that the gate region 316 and the source/drain region 320 are overlapping. A short between the third contact 310 and the fourth contact 312 would indicate that the source/drain region 320 and the source/drain region 322 are overlapping. Accordingly, a short circuit observed between to contacts of an integrated circuit formed according to the test macro 300 can be used to identify the location of an overlay shift, which is causing the short circuit.

In exemplary embodiments, an integrated circuit having a test macro 200 on a portion of the integrated circuit is formed using a multiple patterning lithography process. The test macro 300 is configured to test the multiple patterning lithography process used to form the integrated circuit to determine if an overlay shift has occurred. In exemplary embodiments, testing the operation of the test macro 300 can not only be used to identify that an overlay shift occurred during the multiple patterning lithography process, but it can also identify the location on the test macro of the overlay shift. In exemplary embodiments, the location on the test macro of the overlay shift can be used to determine the patterning step of the multiple patterning lithography process that caused the overlay shift.

Figure 4:
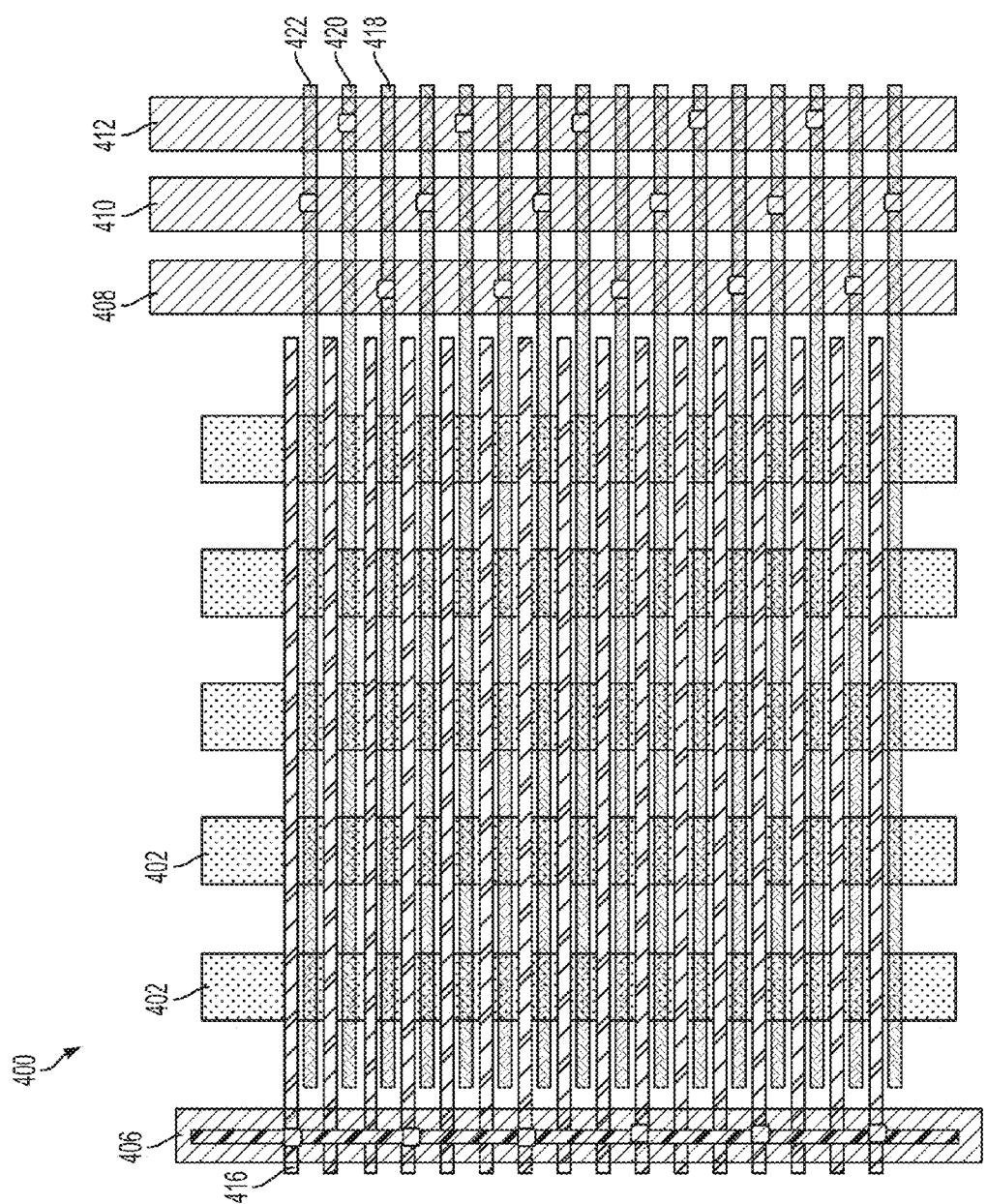
FIG. 4 is a top view of a test macro design in accordance with an exemplary embodiment.

Referring now to FIG. 4, a top view of a test macro 400 in accordance with an exemplary embodiment is shown. As illustrated, the test macro 400 includes a plurality of active regions 402. In exemplary embodiments, the active regions 402 may be bulk finFETs or other various other electrical components that have a dimension of about 10 nanometers. The 10 nanometers refers to the average half-pitch (i.e., half the distance between identical features) of a memory cell at this technology level. In addition, the test macro 400 includes a first contact 406, a second contact 408, a third contact 410 and a fourth contact 412 that are used to access various portions of the active regions 402.

In exemplary embodiments, the active regions 402 includes a gate region 416 that is connected to the first contact 406. The active region 302 also includes source/drain regions 418, 420, 422 that are respectively connected to the second contact 408, the third contact 410 and the fourth contact 412. In exemplary embodiments, the gate region 416 and the source/drain regions 418, 420, 422 may be patterned in subsequent steps of a multiple patterning lithography process. For example, the gate region 416 may be formed during a first patterning step, source/drain regions 418 may be formed during a second patterning step, source/drain regions 420 may be formed during a third patterning step and source/drain regions 422 may be formed in a fourth patterning step.

Accordingly, an overlay shift can occur during any of these subsequent patterning steps which may result in one or more of the adjacent drain regions and source/drain regions contacting one another. In exemplary embodiments, an integrated circuit fabricated having a test macro 400 can be tested to determine the presence, and location, of an overlay shift.

In exemplary embodiments, if two of the adjacent source/drain regions 418, 420, 422 and the gate region 416 are overlapped during patterning process the location of the overlap the location of the overlap is easily ascertainable. For example, if the gate region 416 and the source/drain region 418 are overlapped, a short will be observed between the first contact 408 and the fourth contact 412. Accordingly, a short between the first contact 406 and the second contact 408 would indicate that the gate region 416 and the source/drain region 418 are overlapping. A short between the first contact 406 and the third contact 410 would indicate that the gate region 416 and the source/drain region 420 are overlapping. A short between the third contact 410 and the fourth contact 412 would indicate that the source/drain region 420 and the source/drain region 422 are overlapping. Accordingly, a short circuit observed between to contacts of an integrated circuit formed according to the test macro 400 can be used to identify the location of an overlay shift, which is causing the short circuit.

In exemplary embodiments, an integrated circuit having a test macro 200 on a portion of the integrated circuit is formed using a multiple patterning lithography process. The test macro 400 is configured to test the multiple patterning lithography process used to form the integrated circuit to determine if an overlay shift has occurred. In exemplary embodiments, testing the operation of the test macro 400 can not only be used to identify that an overlay shift occurred during the multiple patterning lithography process, but it can also identify the location on the test macro of the overlay shift. In exemplary embodiments, the location on the test macro of the overlay shift can be used to determine the patterning step of the multiple patterning lithography process that caused the overlay shift.

Figure 5:
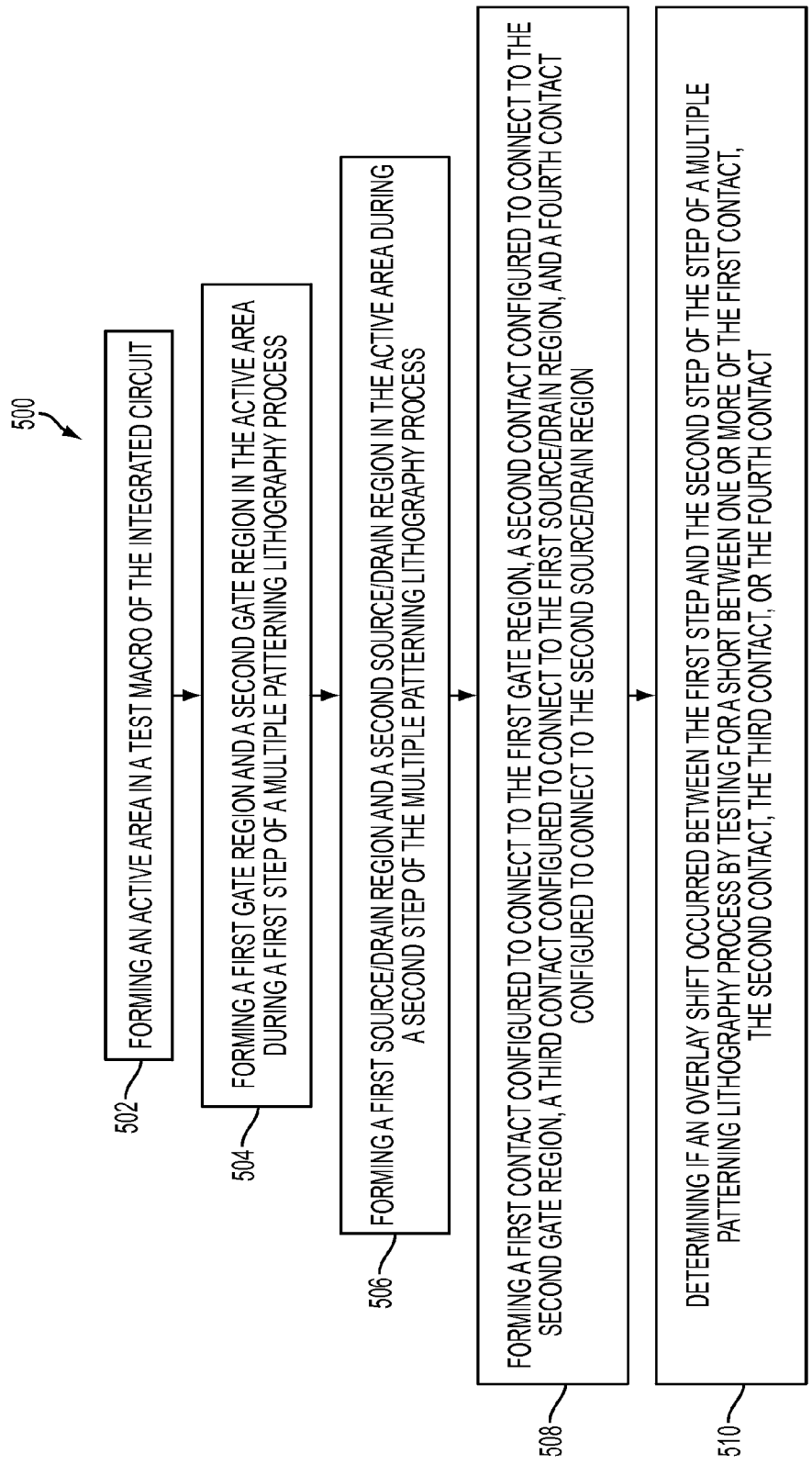
FIG. 5 is flow chart diagram of a method for forming a test macro in accordance with an exemplary embodiment.

Referring now to FIG. 5, a flow chart diagram illustrating a method 500 for forming an integrated circuit having a test macro using a multiple patterning lithography process in accordance with an exemplary embodiment is shown. As illustrated at block 502, the method 500 includes forming an active area of the test macro of the integrated circuit. In exemplary embodiments, the active area is a bulk finFETs or other electrical components that has a dimension of less than 14 nanometers. The 14 nanometers refers to the average half-pitch (i.e., half the distance between identical features) of a memory cell at this technology level. Next, as shown at block 504, the method 500 includes forming a first gate region and a second gate region in the active area during a first step of a multiple patterning lithography process. As shown at block 506, the method 500 also includes forming a first source/drain region and a second source/drain region in the active area during a second step of the multiple patterning lithography process. Next, as shown at block 508, the method 500 includes forming a first contact configured to connect to the first gate region, a second contact configured to connect to the second gate region, a third contact configured to connect to the first source/drain region, and a forth contact configured to connect to the source/drain region. As shown at block 510, the method 500 also includes determining if an overlay shift occurred between the first step and the second step of the step of a multiple patterning lithography process by testing for a short between one or more of the first contact, the second contact, the third contact, or the fourth contact.

Figure 6:
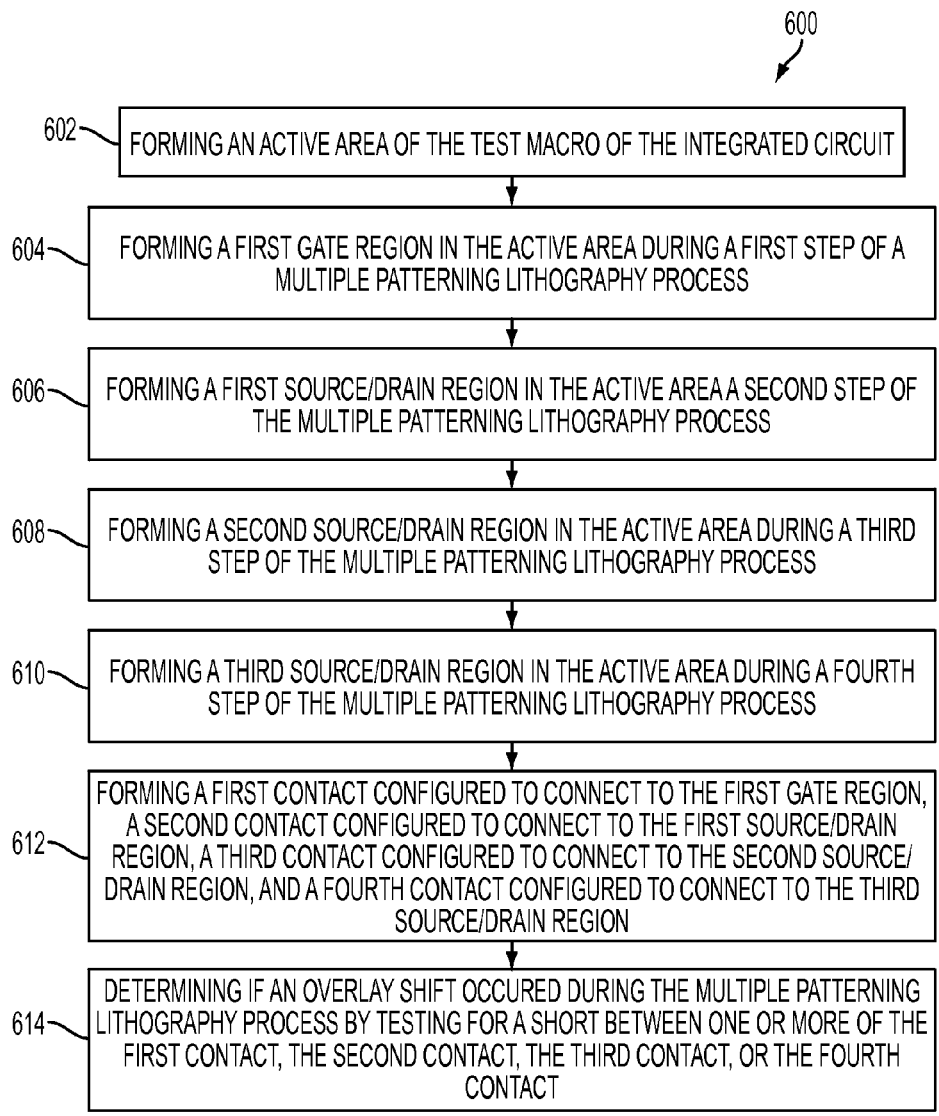
FIG. 6 is flow chart diagram of a method for forming a test macro in accordance with an exemplary embodiment.

Referring now to FIG. 6, a flow chart diagram illustrating a method 600 for forming an integrated circuit having a test macro using a multiple patterning lithography process in accordance with an exemplary embodiment is shown. As illustrated at block 602, the method 600 includes forming an active area of the test macro of the integrated circuit. In exemplary embodiments, the active area is a bulk finFETs or other electrical components that has a dimension of less than 12 nanometers. The 12 nanometers refers to the average half-pitch (i.e., half the distance between identical features) of a memory cell at this technology level. Next, as shown at block 604, the method 600 includes forming a first gate region in the active area during a first step of a multiple patterning lithography process. As shown at block 606, the method 600 also includes forming a first source/drain region in the active area during a second step of the multiple patterning lithography process. Next, as shown at block 608, the method 600 includes forming a second source/drain region in the active area during a third step of the multiple patterning lithography process. As shown at block 610, the method 600 also includes forming a third source/drain region in the active area during a fourth step of the multiple patterning lithography process. Next, as shown at block 612, the method 600 includes forming a first contact configured to connect to the first gate region, a second contact configured to connect to the first source/drain region, a third contact configured to connect to the second source/drain region, and a forth contact configured to connect to the third source/drain region. As shown at block 614, the method 600 also includes determining if an overlay shift occurred during the multiple patterning lithography process by testing for a short between one or more of the first contact, the second contact, the third contact, or the fourth contact.

In exemplary embodiments, the test macro may be located on a portion of the integrated circuit that is designated and a scrap portion. In one embodiment, the scrap portion is an area of the integrated circuit that is not used for fabrication of devices that will be used or sold. For example, the scrap area may be an area of the integrated circuit that will be cut or discarded after the fabrication of the integrated circuit.

The methods and resultant structures described herein provide a test macro disposed on an integrated circuit having high pitch devices, where the integrated circuit is formed using a multiple patterning lithography process. In exemplary embodiments, a short circuit observed between to contacts of the test macro on the integrated circuit can be used to identify the location of an overlay shift, which is causing the short circuit.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:

1. A method for forming an integrated circuit having a test macro using a multiple patterning lithography process, the method comprising:

forming an active area of the test macro of the integrated circuit;

forming a first gate region in the active area during a first step of the multiple patterning lithography process;

forming a first source/drain region in the active area during a second step of the multiple patterning lithography process;

forming a second source/drain region in the active area during a third step of the multiple patterning lithography process;

forming a third source/drain region in the active area during a fourth step of the multiple patterning lithography process; forming a first contact configured to connect to the first gate region, a second contact configured to connect to the first source/drain region, a third contact configured to connect to the second source/drain region, and a fourth contact configured to connect to the third source/drain region; and determining if an overlay shift occurred during the multiple patterning lithography process by testing for a short between one or more of the first contact, the second contact, the third contact, or the fourth contact.

2. The method of claim 1, wherein the active region comprises a bulk finFET.

3. The method of claim 1, wherein the active region includes a transistor having a half-pitch dimension of less than 14 nanometers.

4. The method of claim 1, wherein the active region includes a transistor having a half-pitch dimension of less than 12 nanometers.

5. The method of claim 1, wherein the test macro is formed in a scrap area of the integrated circuit.

6. The method of claim 1, wherein a location of the overlay shift is determined based on the testing for the short between one or more of the first contact, the second contact, the third contact, or the fourth contact.

7. The method of claim 1, further comprising determining which step of the multiple patterning lithography process caused the overlay shift based on the testing for the short between one or more of the first contact, the second contact, the third contact, or the fourth contact.

8. The method of claim 1, wherein the first step, the second step, the third step and the fourth step of the multiple patterning lithography process are performed sequentially.

* * * * *